(12) United States Patent
Hwang

(10) Patent No.: US 8,530,926 B2
(45) Date of Patent: Sep. 10, 2013

(54) LIGHT EMITTING DEVICE

(75) Inventor: Sung Min Hwang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/330,207

(22) Filed: Dec. 19, 2011

(65) Prior Publication Data

US 2012/0091497 A1 Apr. 19, 2012

Related U.S. Application Data

(63) Continuation of application No. 12/980,213, filed on Dec. 28, 2010, now abandoned.

(30) Foreign Application Priority Data

Dec. 29, 2009 (KR) .................. 10-2009-0132733

(51) Int. Cl.
*H01L 33/00* (2010.01)

(52) U.S. Cl.
USPC ............... 257/99; 257/E33.043; 257/E33.066

(58) Field of Classification Search
USPC .............................. 257/99, E33.043, E33.066
See application file for complete search history.

(56) References Cited

U.S. PATENT DOCUMENTS

| | | |
|---|---|---|
| 6,933,169 B2 | 8/2005 | Shibata et al. |
| 7,738,764 B2 | 6/2010 | Kim |
| 2005/0077536 A1 | 4/2005 | Choi et al. |
| 2005/0208686 A1 | 9/2005 | Ryu et al. |
| 2009/0273003 A1 | 11/2009 | Park |
| 2011/0278625 A1 | 11/2011 | Park |

FOREIGN PATENT DOCUMENTS

| | | |
|---|---|---|
| JP | 08-153892 | 6/1996 |
| JP | 08-186287 | 7/1996 |
| JP | 08-250768 | 9/1996 |
| JP | 11-177135 | 7/1999 |
| JP | 2001-068728 A | 3/2001 |
| JP | 2006-156458 | 6/2006 |
| JP | 2008-060227 | 3/2008 |
| KR | 2003-0066957 A | 8/2003 |
| KR | 2005-0035325 A | 4/2005 |
| KR | 10-2009-0104454 A | 10/2009 |
| KR | 102009014454 | * 10/2009 |
| WO | WO 2009/136769 A2 | 11/2009 |

* cited by examiner

*Primary Examiner* — David S Blum
(74) *Attorney, Agent, or Firm* — McKenna Long & Aldridge LLP

(57) ABSTRACT

Embodiments relate to a light emitting device, a light emitting device package, and a lighting system. The light emitting device comprises: a substrate; a light emitting structure over the substrate, the light emitting structure including a first conductive type semiconductor layer, a second conductive type semiconductor layer, and an active layer between the first conductive type semiconductor layer and the second conductive type semiconductor layer, wherein the first conductive type semiconductor layer is partially exposed; a first region having a first concentration and provided at a region of the second conductive type semiconductor layer; a second region having a second concentration and provided at another region of the second conductive type semiconductor layer; and a second electrode over the second conductive type semiconductor layer.

19 Claims, 7 Drawing Sheets

LIGHT EMITTING DEVICE

CROSS-REFERENCE TO RELATED APPLICATIONS

This application is a continuation of U.S. application Ser. No. 12/980,213 filed on Dec. 28, 2010 now abandoned claiming the benefit of claims priority under 35 U.S.C. §119 to Korean Patent Application No. 10-2009-0132733, filed Dec. 29, 2009, both of which are hereby incorporated by reference for all purpose as if fully set forth herein.

BACKGROUND

Embodiments relate to a light emitting device, a light emitting device package, and a lighting system.

A light emitting device (LED) may be implemented by a p-n junction diode, which has the characteristic converting an electrical energy to a light energy, and may be formed by combining a Group III element and a Group V element of the periodic table. The LED may implement various colors by adjusting the composition ratio of a compound semiconductor.

Meanwhile, according to a related art, the lifetime and reliability may be lowered due to current spreading.

Also, according to a related art, in an electrostatic discharge, current flows in a reverse direction, so that an active layer that is a light emitting region may be damaged. To solve the foregoing damage problem, a Zener diode may be equipped in an LED package, which may cause absorption of light.

BRIEF SUMMARY

Embodiments provide a light emitting device, a light emitting device package, and a lighting system that can enhance light extraction efficiency as well as current spreading efficiency.

Embodiments also provide a light emitting device, a light emitting device package, and a lighting system that can prevent damage due to the electrostatic discharge without loss according to absorption of light and can enhance light extraction efficiency as well as current spreading efficiency.

In one embodiment, a light emitting device comprises: a substrate; a light emitting structure over the substrate, the light emitting structure including a first conductive type semiconductor layer, a second conductive type semiconductor layer, and an active layer between the first conductive type semiconductor layer and the second conductive type semiconductor layer, wherein the first conductive type semiconductor layer is partially exposed; a first region having a first concentration and provided at a region of the second conductive type semiconductor layer; a second region having a second concentration and provided at another region of the second conductive type semiconductor layer; and a second electrode over the second conductive type semiconductor layer.

In another embodiment, a light emitting device package comprises: a package body; an electrode layer provided in the package body; and the above light emitting device electrically connected to the electrode layer.

In a further embodiment, a lighting system comprises a light emitting module including a substrate, and a light emitting device package mounted over the substrate, wherein the light emitting device package comprises: a package body; an electrode layer provided in the package body; and the above light emitting device electrically connected to the electrode layer.

DETAILED DESCRIPTION OF THE EMBODIMENTS

Hereinafter, a light emitting device, a light emitting device package, and a lighting system according to the embodiments of the present disclosure will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under the other layer, and one or more intervening layers may also be present. In addition, it will also be understood that when a layer is referred to as being 'between' two layers, it can be the only layer between the two layers, or one or more intervening layers may also be present.

Embodiment

Figure 1:
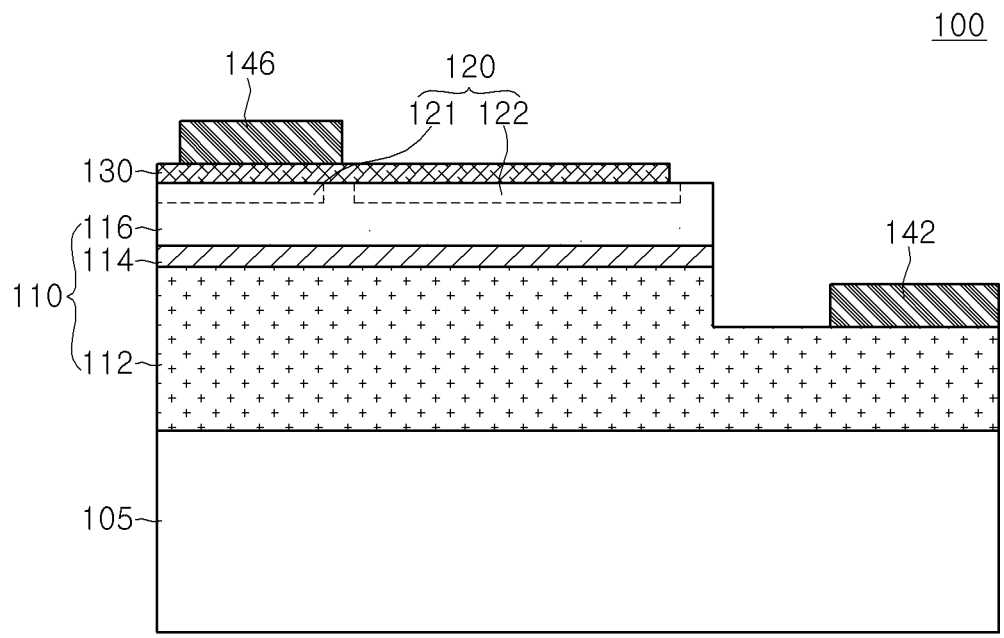
FIG. 1 is a cross-sectional view of a light emitting device according to an embodiment.

FIG. 1 is a cross-sectional view of a light emitting device 100 according to an embodiment.

The light emitting device (LED) 100 according to an embodiment may include: a substrate 105, a first conductive type semiconductor layer 112 over the substrate 105, an active layer 114, and a second conductive type semiconductor layer 116. The first conductive type semiconductor layer 112, the active layer 114, and the second conductive type semiconductor layer 116 constitute a light emitting structure 110. In the light emitting structure 110, a portion of the first conductive type semiconductor layer 112 is exposed. The LED 100 may also include a first region 121 having a first concentration and formed at a region of the second conductive type semiconductor layer 116, a second region 122 having a second concentration and formed at another region of the second conductive type semiconductor layer 116, a second electrode 146 over the second conductive semiconductor layer 116, and a first electrode 142 over an exposed region of the first conductive type semiconductor layer 112.

The first region 121 having the first concentration and the second region 122 having the second concentration may be called ion implantation regions.

The first concentration of the first region 121 may be lower than the second concentration of the second region 122. For example, the first region 121 having the first concentration may be doped at an ion concentration of about $10^{17}$ atom/cm$^3$ or less, but the present disclosure is not limited thereto.

Thus, the first region 121 having the first concentration may be a shottkey contact region.

The second concentration of the second region 122 may be higher than an ion concentration of the second conductive type semiconductor layer 116. For example, the second region 122 having the second concentration may be doped at an ion concentration of $10^{18}$-$10^{19}$ atom/cm$^3$ or more, but the present disclosure is not limited thereto.

Thus, the second region 122 having the second concentration may be an ohmic contact region.

The second region 122 having the second concentration may be formed between the second electrode 146 and the mesa edge region, but the present disclosure is not limited thereto. The mesa edge region may include an opening region exposing at least a part of the etched first conductive semiconductor, but the present disclosure is not limited thereto.

The first region 121 having the first concentration may be formed below the second electrode 146. At least one part of the first region 121 having the first concentration may be vertically overlapped with the second electrode 146.

In the embodiment, The LED 100 may include a transparent electrode 130 over the second conductive type semiconductor layer 116.

Figure 2:
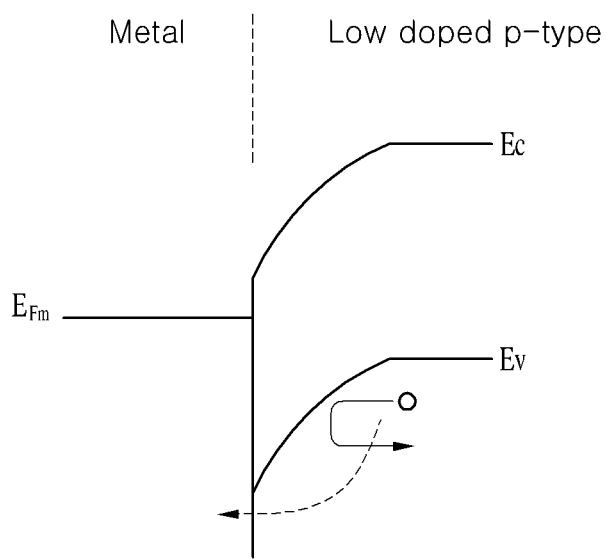
FIGS. 2 and 3 are schematic views for describing shottkey contact and ohmic contact according to an embodiment.
Figure 3:
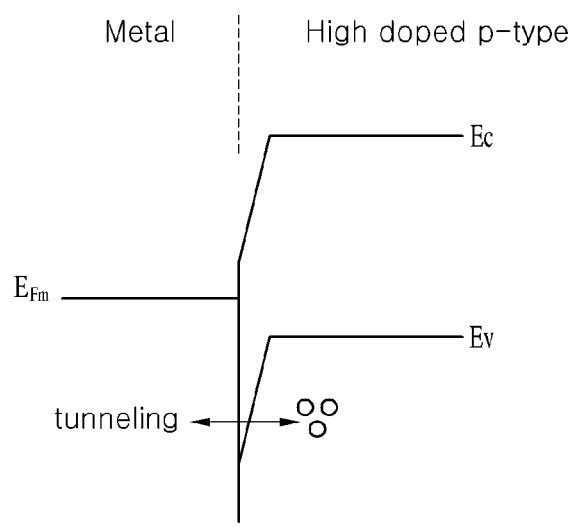

FIGS. 2 and 3 are schematic views for describing shottkey contact and ohmic contact in an LED according to an embodiment.

Concretely, FIG. 2 shows that a shottkey contact is formed due to a low concentration doping of a p-type impurity, and FIG. 3 shows that as a doping concentration of a p-type impurity increases, a depletion width is decreased, and thus an ohmic contact is formed by a tunneling current mechanism.

In the embodiment, as a structure to enhance the current spreading, the second conductive type region 122 having the second concentration (high concentration) may be formed at a portion of the second conductive type semiconductor layer 116 doped at a low concentration through a diffusion or ion implantation.

For example, a region of the second conductive type semiconductor layer 116 below the second electrode 146 is doped at a low concentration, and a remaining region of the second conductive type semiconductor layer 116 other than the region of the second conductive type semiconductor layer 116 below the second electrode 146 is doped at a high concentration.

By doing so, the first region 121 having the second conductive type and lightly doped at the first concentration becomes a region for a shottkey contact, and the second region 122 having the second conductive region and heavily doped at the second concentration becomes a region for an ohmic contact.

According to the embodiment, since the first region of the for the shottkey contact acts as a current blocking layer (CBL), absorption of light in the second electrode 146, for example, p-metal can be decreased and light amount can be increased due to current spreading.

Therefore, according to the embodiment, absorption of light in the second electrode 146 can be decreased and light extracting efficiency can be enhanced through current spreading.

Hereinafter, a concept for an electric field induction will be described with reference to FIGS. 4 and 5.

An LED may be broken due to ESD under backward bias. Under the backward bias, a strong electric field is induced in an active region of the LED by charged particles.

During ESD, carriers (electron & hole) are accelerated and collided with atoms to generate another carrier, and the generated carriers generate a lot of carriers. This phenomenon is called avalanche breakdown. If a strong electric field is induced by charged particles and thus a static electricity in excess of a limit that the semiconductor can endure is applied, the LED may be broken due to avalanche breakdown.

In the embodiment, as a structure to increase a breakdown voltage, the second region 122 having the second concentration may be formed in the second conductive type semiconductor layer 116 around the mesa edge to induce an electric field.

The second region 122 having the second concentration is a region having a higher concentration than the doping concentration of the second conductive type semiconductor layer 116, and may be formed by ion implantation or diffusion.

Figure 4:
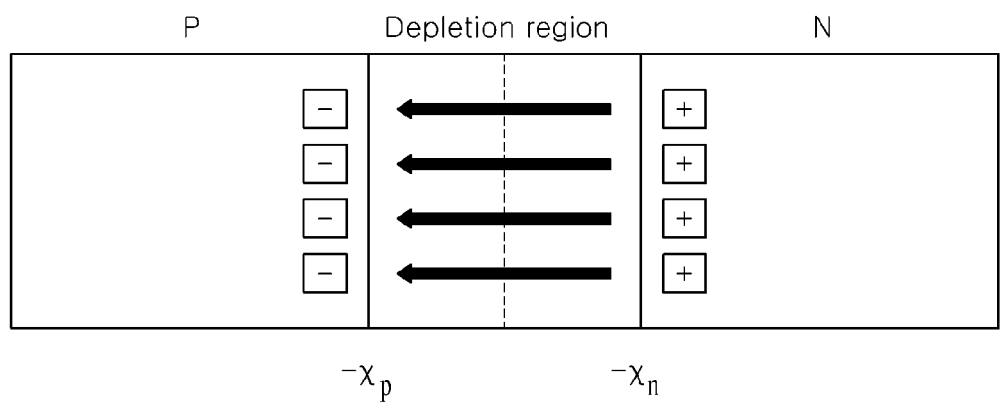
FIGS. 4 and 5 are schematic views for describing induction of an electric field according to an embodiment.
Figure 5:
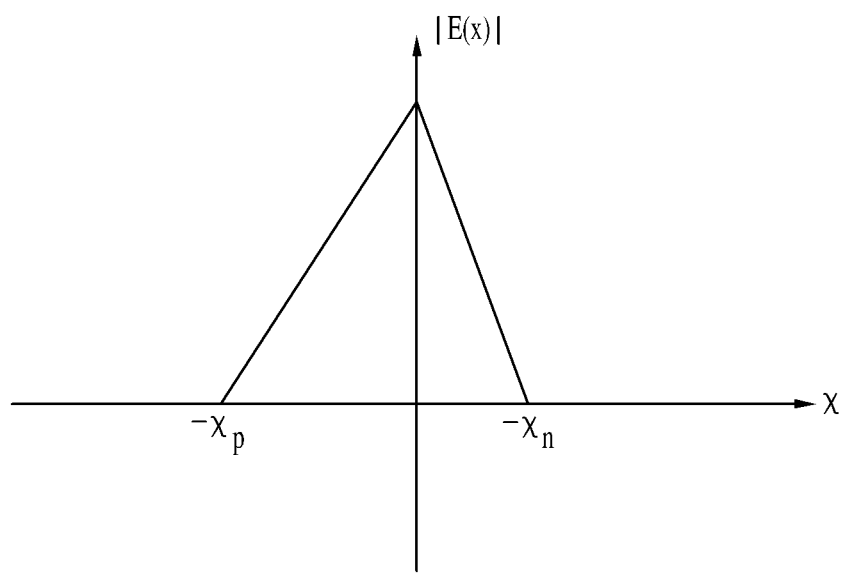

According to the embodiment, as shown in FIGS. 4 and 5 and the following equation, the higher the doping concentration NA, ND is, the stronger the electric field induced in the depletion region by ionized charges is.

$$E(x) = \frac{qN_A}{\varepsilon_x \varepsilon_0}(x_p + x) \text{ where } -x_p \leq x \leq 0$$
$$= \frac{qN_D}{\varepsilon_x \varepsilon_0}(x_n + x) \text{ where } -x_n \leq x \leq 0$$

According to the embodiment, through the foregoing structure, the strong electric field generated in the mesa edge region may be induced into the second region 122 having the second concentration or may be suppressed to decrease the avalanche breakdown, so that the breakdown voltage may be increased and the leakage current may be decreased.

Also, since the second region 122 heavily doped at the second concentration is formed between the second electrode 146 and the mesa edge region, the current spreading of the LED can be enhanced to induce an increase of light amount.

Hereinafter, a method for manufacturing an LED according to an embodiment will be described with reference to FIGS. 6 through 8. In the embodiment, the LED may be formed of a III-V compound semiconductor such as GaN, GaAs, GaAsP, GaP, or the like, but the present disclosure is not limited thereto. The sequence of processes to be described below is not limited to the following description, but may be modified.

Figure 6:
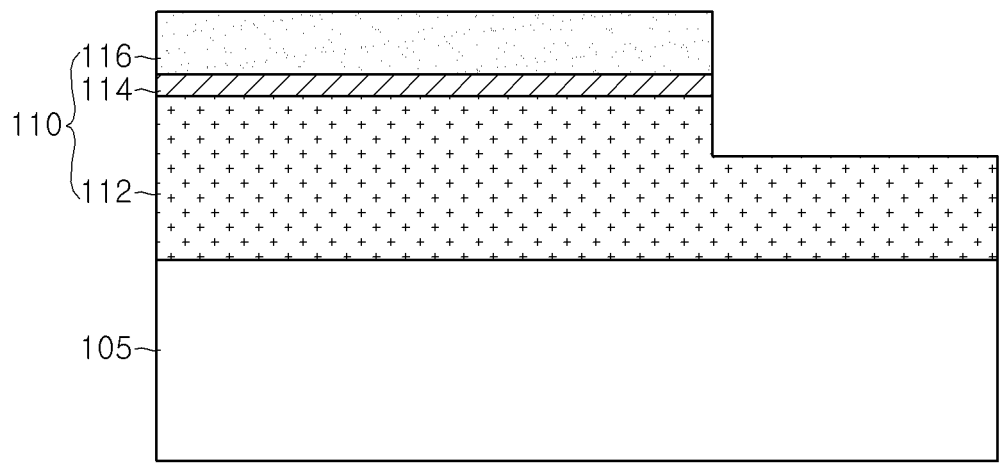
FIGS. 6 through 8 are cross-sectional views illustrating a method for manufacturing a light emitting device according to a second embodiment.

First, as shown in FIG. 6, a substrate 105 is prepared. The substrate 105 may be at least one of sapphire (Al$_2$O$_3$), SiC, Si, GaAs, GaN, ZnO, Si, GaP, InP, Ge and Ga$_2$O$_3$ substrates. While an irregular structure may be formed at an upper surface of the substrate 105, the present disclosure is not limited thereto. A wet etching may be performed with respect to the substrate 105 to remove an impurity of a surface of the substrate 105.

Thereafter, a light emitting structure 110 including a first conductive type semiconductor layer 112, an active layer 114 and a second conductive type semiconductor layer 116 may be formed over the substrate 105.

The light emitting structure 110 may be formed by using, for example, a metal organic chemical vapor deposition (MOCVD), a chemical vapor deposition (CVD), a plasma-enhanced chemical vapor deposition (PECVD), a molecular beam epitaxy (MBE), a hydride vapor phase epitaxy (HYPE), or the like, but the present disclosure is not limited thereto.

A buffer layer (not shown) may be formed over the substrate 105. The buffer layer may buffer a lattice mismatch between the materials constituting the light emitting structure 110 and the substrate 105, and the buffer layer may be formed of a III-V compound semiconductor, for example, at least one of GaN, InN, AlN, InGaN, AlGaN, InAlGaN, and AlInN. An undoped semiconductor layer (not shown) may be formed over the buffer layer, but the present disclosure is not limited thereto.

The first conductive type semiconductor layer 112 may be implemented by a III-V compound semiconductor doped with a first conductive type dopant. In the case where the first conductive type semiconductor layer 112 is an N-type semiconductor layer, the first conductive type dopant is an N-type dopant and may include Si, Ge, Sn, Se, and/or Te as the N-type dopant, but the present disclosure is not limited thereto.

The first conductive type semiconductor layer 112 may include a semiconductor material having a compositional formula of $In_xAl_yGa_{1-x-y}N$ ($0 \leq x \leq 1$, $0 \leq y \leq 1$, $0 \leq x+y \leq 1$).

The first conductive type semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 112 may be an N-type GaN layer, which is formed by using a chemical vapor deposition (CVD), a molecular beam epitaxy (MBE), a sputtering, a hydride vapor phase epitaxy (HYPE), or the like. Also, the first conductive type semiconductor layer 112 may be formed by injecting trimethyl gallium (TMGa) gas, ammonia ($NH_3$) gas, nitrogen ($N_2$) gas, and silane ($SiH_4$) gas including an n-type impurity such as silicon (Si).

The active layer 114 may be formed in at least one of a single quantum well structure, a multi quantum well (MQW) structure, a quantum-wire structure, and a quantum dot structure. For example, the active layer 114 may be formed in the MQW structure by injecting trimethyl gallium (TMGa) gas, ammonia ($NH_3$) gas, nitrogen ($N_2$) gas, and trimethyl indium (TMIn) gas, but the present disclosure is not limited thereto.

Well layer/barrier layer of the active layer 114 may be formed in at least one pair structure of InGaN/GaN, InGaN/InGaN, AlGaN/GaN, InAlGaN/GaN, GaAs/AlGaAs(InGaAs), GaP/AlGaP(InGaP), but the present disclosure is not limited thereto. The well layer may be formed of a material having a band gap lower than a band gap of the barrier layer.

A conductive clad layer may be formed over or/and below the active layer 114. The conductive clad layer may be formed of an AlGaN-based semiconductor, and may have a band gap higher than the active layer 114.

The second conductive type semiconductor layer 116 may include a III-V compound semiconductor, for example, semiconductor material having a compositional formula of $In_xAl_yGa_{1-x-y}N$ ($0 \leq x \leq 1$, $0 \leq y \leq 1$, $0 \leq x+y \leq 1$). The second conductive type semiconductor layer 116 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP. In the case where the second conductive type semiconductor layer 116 is a P-type semiconductor layer, the second conductive type dopant may include Mg, Zn, Ca, Sr, Ba, or the like as a P-type dopant. The second conductive type semiconductor layer 116 may be formed in a single- or multi-layer structure, but the present disclosure is not limited thereto.

The second conductive type semiconductor layer 116 may be a P-type GaN layer, which is formed by injecting trimethyl gallium (TMGa) gas, ammonia ($NH_3$) gas, nitrogen ($N_2$) gas, and biscetyl cyclo pentadienyl magnesium (($EtCp_2Mg$){Mg ($C_2H_5C_5H_4$)$_2$}) including a P-type impurity such as Mg into a chamber, but the present disclosure is not limited thereto.

In the embodiment, the first conductive type semiconductor layer 112 may be implemented by an N-type semiconductor layer and the second conductive type semiconductor layer 116 may be implemented by a P-type semiconductor layer, but the present disclosure is not limited thereto. Alternatively, a semiconductor layer having an opposite conductive type to the second conductive type, for example, an N-type semiconductor layer (not shown) may be formed over the second semiconductor layer 116. Accordingly, the light emitting structure 110 may be implemented in at least one of an N-P junction structure, a P-N junction structure, an N-P-N junction structure, and a P-N-P junction structure.

Next, the light emitting structure 110 may be mesa-etched to expose a portion of the first conductive type semiconductor layer 112. For example, by sequentially etching the second conductive type semiconductor layer 116, the active layer 114, and an upper portion of the first conductive type semiconductor layer 112 at a region where the first electrode 142 is being formed, using a mask having a pattern (not shown), an upper surface of the first conductive type semiconductor layer 112 may be exposed.

Figure 7:
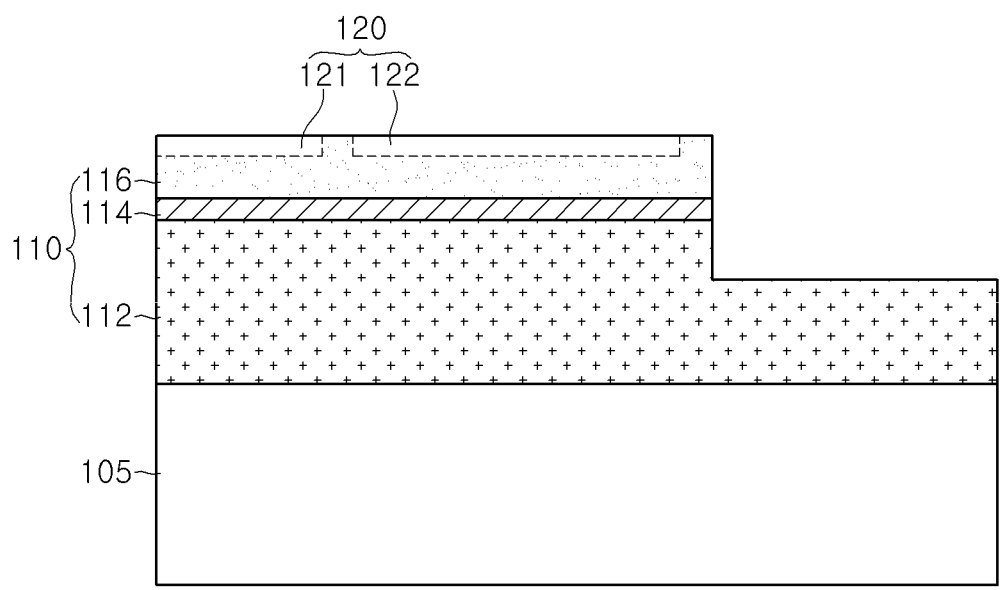

Next, as shown in FIG. 7, a first region 121 having a first concentration and a second region 122 having a second concentration may be formed in the second conductive type semiconductor layer 116.

The first region 121 having the first concentration and the second region 122 having the second concentration may be formed by separate processes.

The first concentration of the first region 121 may be lower than the second concentration of the second region 122. For example, the first region 121 having the first concentration may be doped at an ion concentration of about $10^{17}$ atom/cm$^3$ or less, but the present disclosure is not limited thereto.

The first region 121 having the first concentration may be formed by an ion implantation or diffusion.

Thus, the first region 121 may be a shottkey contact region.

The first region 121 having the first concentration may be formed below the second electrode 146 to be formed later.

The second concentration of the second region 122 may be higher than an ion concentration of the second conductive type semiconductor layer 116. For example, the second region 122 having the second concentration may be doped at an ion concentration of $10^{18}$-$10^{19}$ atom/cm$^3$ or more, but the present disclosure is not limited thereto.

Thus, the second region 122 having the second concentration may be an ohmic contact region.

The second region 122 having the second concentration may be formed so as not to contact the mesa edge region, but the present disclosure is not limited thereto.

The second region 122 having the second concentration may be formed between the second electrode and the mesa edge region, but the present disclosure is not limited thereto.

The second region 122 having the second concentration is a region having a higher concentration than a doping concentration of the second conductive type semiconductor layer 116, and may be formed by an ion implantation or diffusion.

In the embodiment, the first region 121 having the second conductive type and lightly doped at the first concentration becomes a region for a shottkey contact, and the second region 122 having the second conductive region and heavily doped at the second concentration becomes a region for an ohmic contact.

Therefore, according to the embodiment, absorption of light in the second electrode 146 can be decreased and light extracting efficiency can be enhanced through current spreading.

Also, in the embodiment, the second region 122 having the second concentration has a structure for increasing the breakdown voltage, and may be formed in the second conductive type semiconductor layer 116 around the mesa edge to induce an electric field.

According to the embodiment, through the foregoing structure, the strong electric field generated in the mesa edge region may be induced into the second region 122 having the second concentration or may be suppressed to decrease the avalanche breakdown, so that the breakdown voltage may be increased and the leakage current may be decreased.

Figure 8:
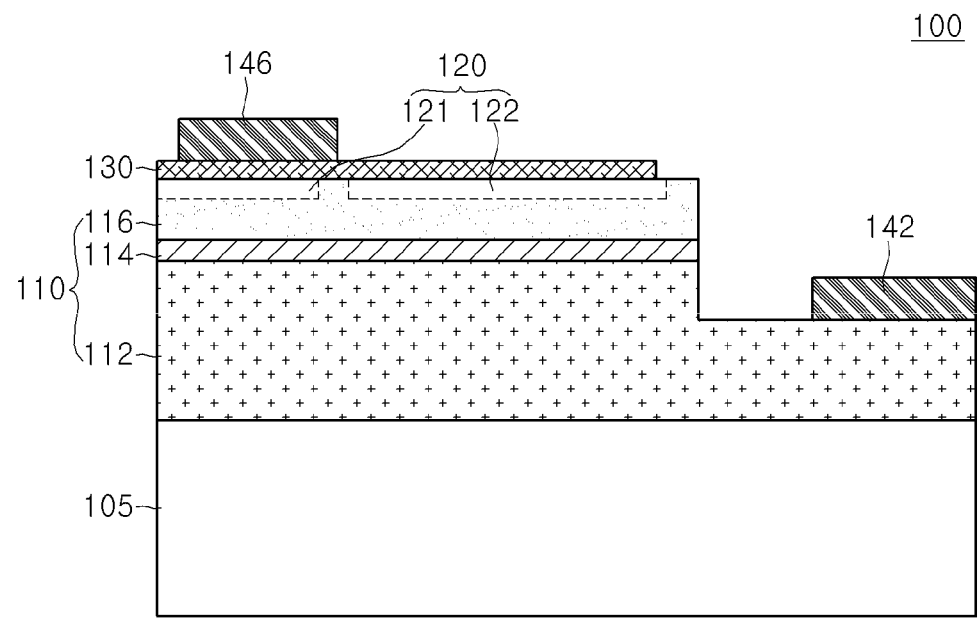

Next, as shown in FIG. 8, a transparent electrode 130 may be formed over the second conductive type semiconductor layer 116 in which the second conductive ion implantation region 120 is formed. For example, the transparent electrode 130 may be formed by multi-stacking a single metal layer, a metal alloy layer, and/or a metal oxide layer. For example, the ohmic layer may be formed including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the present disclosure is not limited thereto.

Next, a first electrode 142 may be formed over the exposed first conductive type semiconductor layer 112, and the second electrode 146 may be formed over the transparent electrode 130.

The first and second electrodes 142 and 146 may be formed of at least one of titanium (Ti), chromium (Cr), nickel (Ni), aluminum (Al), platinum (Pt), gold (Au), and tungsten (W), but the present disclosure is not limited thereto.

By the LED and the method for manufacturing an LED according to the embodiments, efficient current flow can be controlled to thus increase light extracting efficiency.

Also, according to the embodiments, the reliability of the LED can be enhanced by current spreading.

Further, according to the embodiments, an ESD damage of the LED can be prevented without loss followed by absorption of light.

Figure 9:
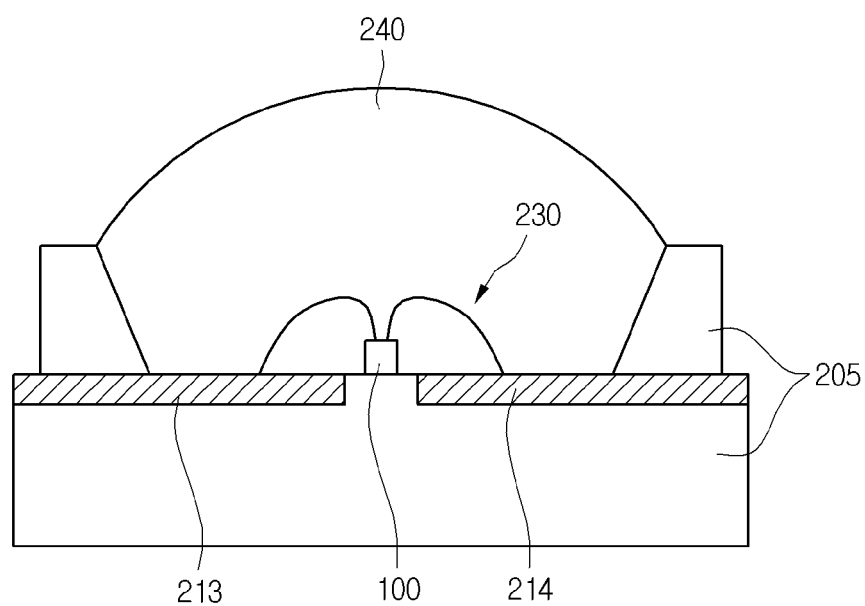
FIG. 9 is a cross-sectional view of a light emitting device package according to an embodiment.

FIG. 9 is a cross-sectional view of a light emitting device package 200 according to an embodiment.

Referring to FIG. 9, the light emitting device package 200 according to the embodiment includes a package body 205, third and fourth electrode layers 213 and 214 mounted over the package body 205, an LED 100 mounted over the package body 205 and electrically connected to the third and fourth electrode layers 213 and 214, and a molding member 240 enclosing the LED 100.

The package body 205 may be formed including a silicon material, a synthetic resin material, or a metal material, and may have an inclination surface around the LED 100.

The third electrode layer 213 and the fourth electrode layer 214 are electrically separated, and function to supply power to the LED 100. Also, the third and fourth electrode layers 213 and 214 may reflect light generated from the LED 100 to thus increase light efficiency, and may emit heat generated from the LED 100.

The LED 100 may be a vertical type LED shown in FIG. 1, but the present disclosure is not limited thereof.

The LED 100 may be mounted over the package body 205 or over the third electrode layer 213 or the fourth electrode layer 214.

The LED 100 may be electrically connected to the third electrode layer 213 and/or the fourth electrode layer 214 by using any one of a wire bonding method, a flip chip method, and a die bonding method. While the current embodiment exemplarily shows that the LED 100 is electrically connected to the third electrode layer 213 and the fourth electrode layer 214 through a wire 230, the present disclosure is not limited thereto.

The molding member 240 may enclose and protect the LED 100. Also, a fluorescent material may be included in the molding member 240 to change the wavelength of light emitted from the LED 100.

The light emitting device package according to the embodiment may include a plurality of optical members, such as a light guide panel, a prism sheet, a diffusion sheet, a fluorescent sheet, and the like, which are arranged on a path of light emitted from the light emitting device package. The light emitting device package, substrate and optical members may function as a backlight unit or lighting unit, and a lighting system may include, for example, a backlight unit, a lighting unit, an indicator unit, a lamp, a streetlamp, etc.

Figure 10:
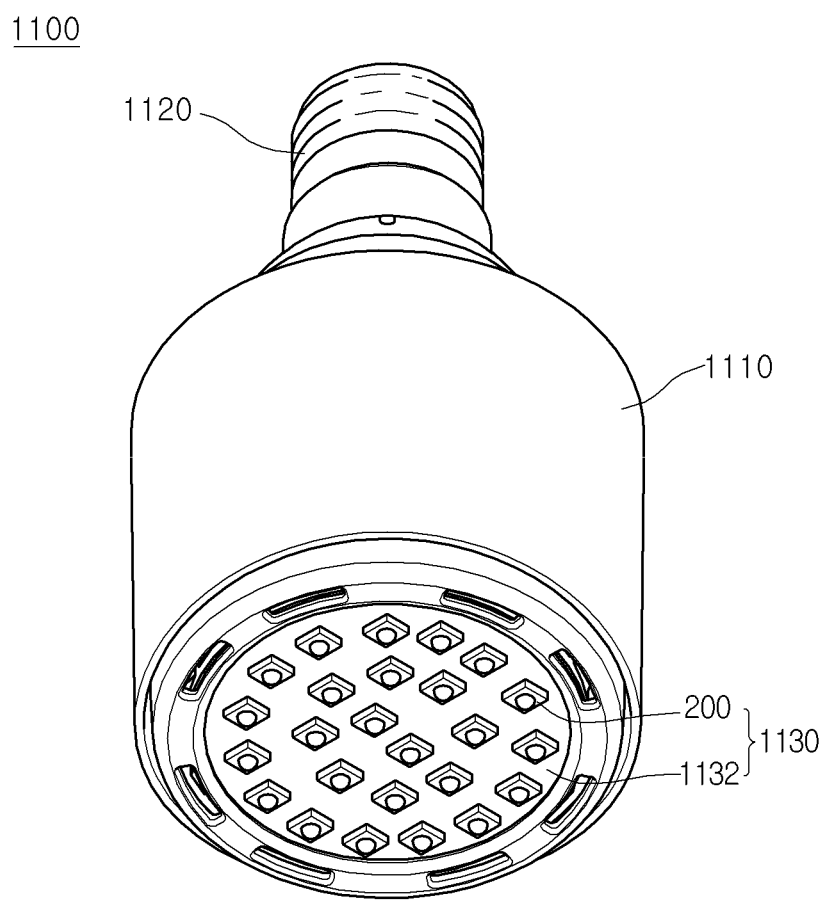
FIG. 10 is a perspective view of a lighting unit according to an embodiment.

FIG. 10 is a perspective view of a lighting unit 1100 according to an embodiment. The lighting unit 110 shown in FIG. 10 is an example of lighting systems, and the present disclosure is not limited thereto.

Referring to FIG. 10, the lighting unit 1100 may include a case body 1110, a light emitting module part 1130 equipped in the case body 1110, and a connection terminal 1120 equipped in the case body 1110 and supplied with an electric power from an external power supply.

The case body 110 may be preferably formed of a material having good heat shielding characteristics, for example, a metal material or a resin material.

The light emitting module part 1130 may include a substrate 1132, and at least one light emitting device package 200 mounted on the substrate 1132.

The substrate 1132 may be an insulator substrate on which a circuit pattern is printed, and may include, for example, a general printed circuit board (PCB), a metal core PCB, a flexible PCB, a ceramic PCB, etc.

Also, the substrate 1132 may be formed of a material to efficiently reflect light, and a surface thereof may be formed in a color capable of efficiently reflecting light, for example, white color, or silver color.

The at least one light emitting device packages 200 may be mounted on the substrate 1132. Each of the light emitting device packages 200 may include at least one light emitting diode (LED) 100. The light emitting diode 100 may include a color LED emitting red, green, blue or white light, and a UV LED emitting ultraviolet (UV).

The light emitting module part 1130 may have a combination of several LEDs so as to obtain desired color and luminance. For example, the light emitting module part 1130 may have a combination of a white LED, a red LED, and a green LED so as to obtain a high color rendering index (CRI).

The connection terminal 1120 may be electrically connected to the light emitting module part 1130 to supply power. As shown in FIG. 10, the connection terminal 1120 may be screwed and coupled to an external power in a socket type, but the present disclosure is not limited thereto. For example, the connection terminal 1120 may be made in a pin type and inserted into an external power, or may be connected to the external power through a power line.

Figure 11:
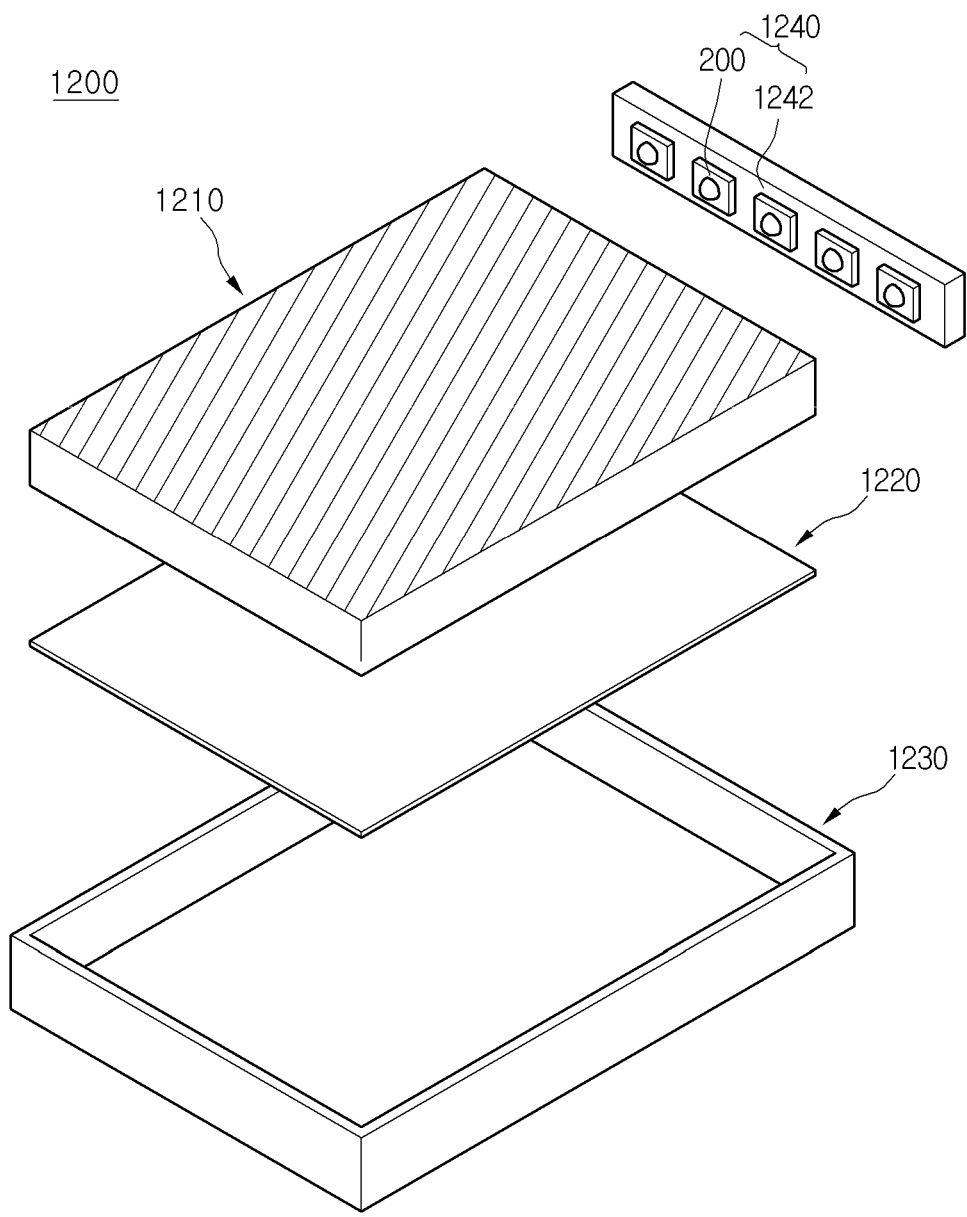
FIG. 11 is a disassembled perspective view of a backlight unit according to an embodiment.

FIG. 11 is a disassembled perspective view of a backlight unit 1200 according to an embodiment. The backlight unit 1200 shown in FIG. 11 is an example of lighting systems, and the present disclosure is not limited thereto.

The backlight unit 1200 according to the embodiment may include a light guide panel 1210, a light emitting module part 1240 supplying light to the light guide panel 1210, a reflective member 1220 below the light guide panel 1210, and a bottom cover 1230 receiving the light guide panel 1210, the light emitting module part 1240, and the reflective member 1220, but the present disclosure is not limited thereto.

The light guide panel 1210 functions to transform linear light to planar light by diffusing the linear light. For example, the light guide panel may include one of acryl-series resin such as polymethyl metaacrylate (PMMA), polyethylene terephthlate (PET), poly carbonate (PC), COC, and polyethylene naphthalate resin.

The light emitting module part 1240 provides light to at least a side surface of the light guide panel 1210, and finally acts as a light source of a display device in which the backlight unit is equipped.

The light emitting module part 1240 may contact the light guide panel 1210, but the present disclosure is not limited thereto. Concretely, the light emitting module part 1240 includes a substrate 1242, and a plurality of light emitting device packages 200 mounted on the substrate 1242. The substrate 1242 may contact the light guide panel 1210, but the present disclosure is not limited thereto.

The substrate 1242 may be a PCB including a circuit pattern (not shown). The substrate 1242 may include a metal core PCB (MCPCB), a flexible PCB (FPCB), etc. as well as the general PCB, but the present disclosure is not limited thereto.

The plurality of light emitting device packages 200 may be mounted over the substrate 1242 such that light emitting surfaces of the plurality of light emitting device packages 200 are spaced apart by a predetermined distance from the light guide panel 1210.

The reflective member 1220 may be provided below the light guide panel 1210. The reflective member 1220 reflects light incident from a bottom surface of the light guide panel to allow the reflected light to be directed toward an upper direction, thereby capable of enhancing brightness of the backlight unit. The reflective member 1220 may be formed of, for example, PET, PC, PVC resin, or the like, but the present disclosure is not limited thereto.

The bottom cover 1230 may receive the light guide panel 1210, the light emitting module part 1240, the reflective member 1220, and the like. For this purpose, the bottom cover 1230 may be formed in a box shape a top surface of which is opened, but the present disclosure is not limited thereto.

The bottom cover 1230 may be formed of a metal material or resin material, and may be manufactured by using a process such as a press molding or an injection molding.

As described above, the lighting system according to the embodiment includes the light emitting device package according to the embodiment, so that the reliability can be enhanced.

Any reference in this specification to 'one embodiment,' 'an embodiment,' 'example embodiment,' etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate;
a light emitting structure over the substrate, the light emitting structure including a first conductive type semiconductor layer, a second conductive type semiconductor layer, and an active layer between the first conductive type semiconductor layer and the second conductive type semiconductor layer, wherein the first conductive type semiconductor layer is partially exposed;
a first region of the second conductive type semiconductor layer having a first ion concentration;
a second region of the second conductive type semiconductor layer having a second ion concentration; and
a second electrode over the second conductive type semiconductor layer,
wherein only the first region among the first region and the second region is vertically overlapped with the second electrode.

2. The light emitting device of claim 1, comprising a first electrode over the exposed first conductive type semiconductor layer.

3. The light emitting device of claim 1, wherein the first region is a second conductive type ion implantation region.

4. The light emitting device of claim 3, wherein the first region is formed at a concentration lower than an ion concentration of the second conductive type semiconductor layer.

5. The light emitting device of claim 4, wherein the first region is doped at an ion concentration of $10^{17}$ atom/cm$^3$ or less.

6. The light emitting device of claim 1, wherein the first region is a schottky contact region.

7. The light emitting device of claim 1, wherein the second region is a second conductive type ion implantation region.

8. The light emitting device of claim 7, wherein the second region is formed at a concentration higher than an ion concentration of the second conductive type semiconductor layer.

9. The light emitting device of claim 8, wherein the second concentration is doped at an ion concentration of $10^{18}$-$10^{19}$ atom/cm$^3$ or more.

10. The light emitting device of claim 1, wherein the second region is an ohmic contact region.

11. The light emitting device of claim 1, wherein the second region having the second concentration is formed between the second electrode and a mesa edge region.

12. The light emitting device of claim 1, wherein at least one part of the first region is vertically overlapped with the second electrode.

13. A light emitting device comprising:
a substrate;

a light emitting structure over the substrate, the light emitting structure including a first conductive type semiconductor layer, a second conductive type semiconductor layer, and an active layer between the first conductive type semiconductor layer and the second conductive type semiconductor layer, wherein the first conductive type semiconductor layer is partially exposed;

a first region of the second conductive type semiconductor layer having a first ion concentration;

a second region of the second conductive type semiconductor layer having a second ion concentration; and a second electrode over the second conductive type semiconductor layer, wherein the first region is positioned at a same height comparing to the second region.

14. The light emitting device of claim 13, wherein a width of the first region is smaller than a width the second conductive type semiconductor layer.

15. The light emitting device of claim 13, wherein a width of the second region is smaller than a width the second conductive type semiconductor layer.

16. The light emitting device of claim 13, wherein an ion concentration of the first region is lower than an ion concentration of the second conductive type semiconductor layer.

17. The light emitting device of claim 13, wherein an ion concentration of the second region is higher than an ion concentration of the second conductive type semiconductor layer.

18. The light emitting device of claim 13, wherein an ion concentration of the first region is lower than an ion concentration of the second region.

19. The light emitting device of claim 13, wherein an ion concentration of the first region is lower than an ion concentration of the second region, and wherein the first region and the second region are positioned on a top surface of the second semiconductor layer.

* * * * *